United States Patent
Falconer

(10) Patent No.: US 6,774,819 B1
(45) Date of Patent: Aug. 10, 2004

(54) FLEXIBLE KEYBOARD

(75) Inventor: Maynard Falconer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/361,500

(22) Filed: Jul. 23, 1999

(51) Int. Cl.$^7$ .................. H03K 17/94; H03M 11/00
(52) U.S. Cl. .................. 341/22; 345/168; 200/512; 400/712
(58) Field of Search .............. 341/22, 33, 34, 341/27; 345/174, 173, 168; 361/749; 200/511, 512; 400/712

(56) References Cited

U.S. PATENT DOCUMENTS

| | | | | |
|---|---|---|---|---|
| 4,429,301 A | * | 1/1984 | Crumley et al. | 341/22 |
| 4,617,554 A | * | 10/1986 | Krause et al. | 341/22 |
| 5,616,897 A | * | 4/1997 | Weber et al. | 200/5 A |
| 5,680,126 A | * | 10/1997 | Kikinis | 341/22 |
| 5,719,597 A | * | 2/1998 | Fong | 345/178 |
| 5,844,506 A | * | 12/1998 | Binstead | 341/34 |
| 2003/0048256 A1 | * | 3/2003 | Salmon | 345/168 |

FOREIGN PATENT DOCUMENTS

GB    2 279 617 A  * 11/1995

* cited by examiner

Primary Examiner—Timothy Edwards
(74) Attorney, Agent, or Firm—Fish & Richardson P.C.

(57) ABSTRACT

A flexible keyboard formed from a grid of flexible wires. Crosspoints between the wires are used to define characters to be selected via the keyboard. The characters are selected by pressing at a location, pressing two wires against one another.

13 Claims, 3 Drawing Sheets

FLEXIBLE KEYBOARD

The present application describes a lightweight flexible keyboard formed from a grid of wires encased in an outer sheath.

BACKGROUND

It is often desirable to make a computer as small as possible. The size of a computer, however, is often limited by the sizes of the input and output devices.

Computer data is often input from a keyboard. Data entry by a keyboard requires a certain minimum size that accommodates the user's hands and the conventional typing style. Laptops and other portable computers can be made with reduced-size keyboards in order to save on space. However, a typist may often feel cramped by the reduced size of the keyboard.

SUMMARY

The present system teaches a flexible keyboard formed of a grid of wires which are position encoded. The flexible keyboard can be folded or rolled when not in use. The grid includes a waterproof cover, including an overlay, including an indication of a plurality of characters, and having a pressing surface allowing pressing against a location at an intersection between two wires of the grid. A position detecting circuit, detects the position of pressing and converts that position of pressing to a character that is represented thereby.

In an embodiment, the keyboard is formed by a grid of wires that cross at locations. The crossing locations define allowable key press locations. An encoding circuit determines the location of pressing based on the wires that are selected.

The grid is wrapped in a waterproof material, with a character set printed on a top surface of the material. Application of pressure at any specific location causes a contact to be made. The position of contact is determined from the encoding circuit, and converted to a letter indicating the position. A look up table can be used to convert between the position and the letter it represents.

In one embodiment, the wires are coated wires with openings in the coating at crosspoint locations to allow them to make contact. In another embodiment, a resistive ladder is used to produce an output voltage that depends on the location of pressing.

BRIEF DESCRIPTION OF THE DRAWINGS

These and other aspects will now be described in detail with reference to the accompanying drawings, wherein.

DESCRIPTION OF THE PREFERRED EMBODIMENTS

Figure 1:
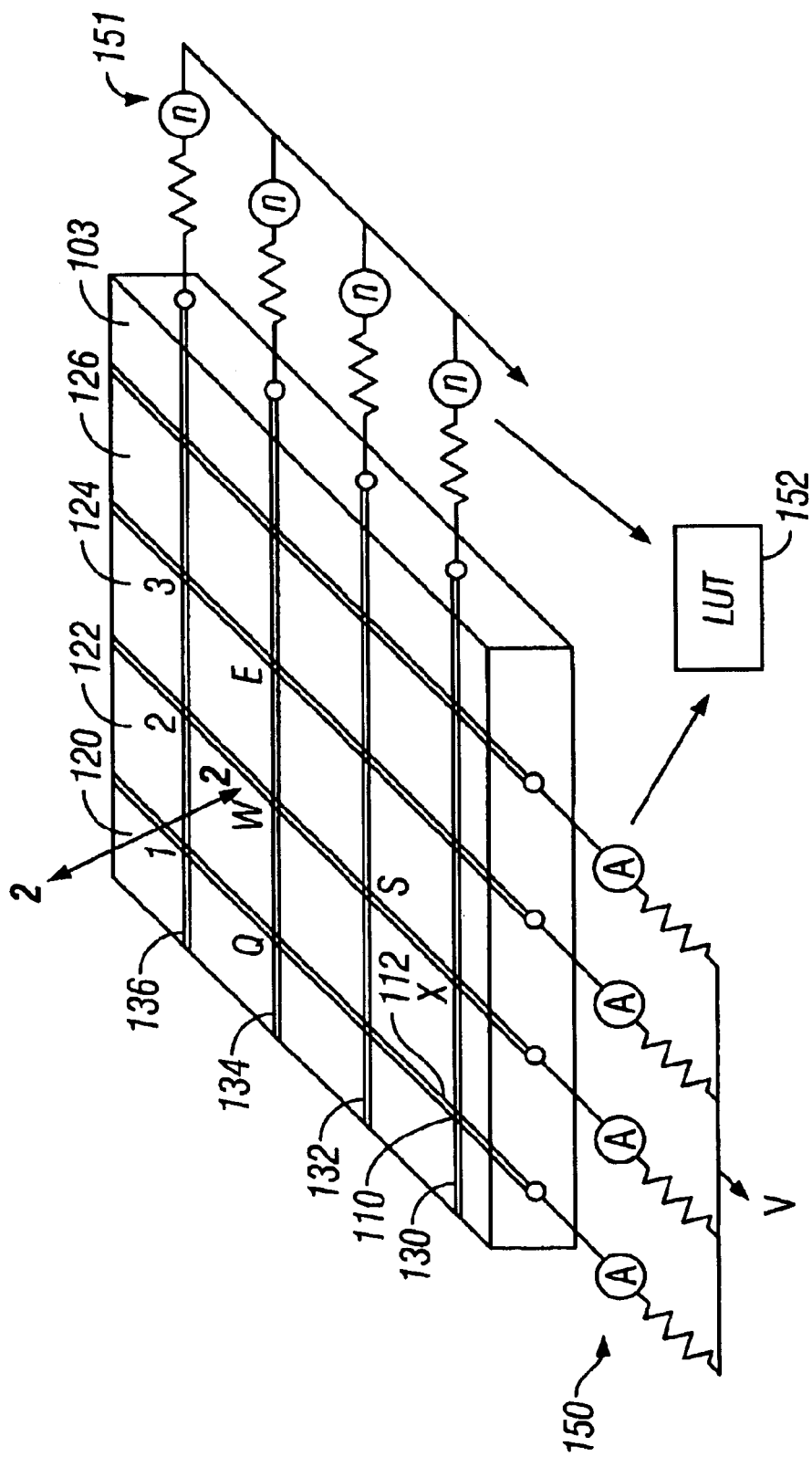
FIG. 1 shows a conceptual diagram of the overall keyboard including the wires that form the cross point.

An embodiment is shown with a keyboard 99 formed of a grid of wires 100 which are position-encoded. An associated position detecting circuit detects the position of pressing and converts that position of pressing to a character that is represented by that position.

The wires are arranged into a plurality of column extending wires 120, 122, 124, 126 and row extending wires 130, 132, 134 and 136. A key is activated by pressing an active area at or near the intersection between any two wires. That intersection area is also imprinted with an overlay that represents a specific character.

Each of the row and column wires is formed of wire with a coated portion 110 and an uncoated portion 112. A character is defined at an intersection between two uncoated portions of a row wire and a column wire. Each of the wires are electrically floating. By pressing down at the location of the character, the two wires are shorted together. This electrically connects the column wire 120, which here is shown biased to a voltage, together with the row wire 130, which here is shown connected to ground. After the two wires are connected together, current flows between the column wire 120 and the row wire 130.

The encoders 150, 151 can use ammeters to sense current flow in the wires. The ammeter senses which of the wires is conducting. The wires that are conducting indicate the column and row position. A look up table 152 translates this row and column position into a letter represented by that position.

The two orthogonally-directed parallel sets of wires are made of flexible material so that the whole unit can be folded and/or rolled, and so that the wires can be pressed to touch one wire against another of the wires. The wires can be braided or goose-neck material, for example.

FIG. 1 shows a first embodiment using encoder circuits 150, 151 to encode which of the row and column wires are conducting voltages. The system operates by detecting the position where the two wires are shorted. An overlying character set 100 is printed on the top surface 103. Each letter is printed over uncoated portions 112 at the intersection of the two wires.

Figure 2:
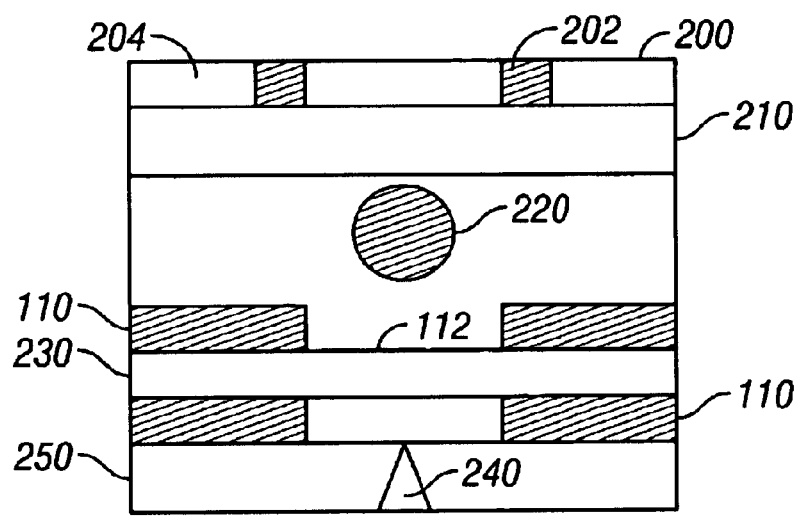
FIG. 2 shows a cross-sectional view along the line 2—2 in FIG. 1.

FIG. 2 shows a cross section along the line 2—2 in FIG. 1. This shows the functional layers that make up the device. A top layer 200 includes a printing layer, which includes a print portion 202 which preferably is formed into the shape of a character, and a planarizing portion 204 surrounding the print portion. Other alternatives include a relatively flat print portion or simply allowing a raised portion 202 where the ink is placed.

A overlaying plastic layer 210 encases the two wires and provides waterproofing for the keyboard. The two wires are shown below the overlying plastic casing 210. Wire 220 represents the column wire, and in the cross section is shown as bare wire. Of course, areas on both sides of the shown cross section would actually be coated. Row wire 230 is shown with its uncoated portion 112 and its coated portion 110.

Layer 240 represents a tactile feedback mechanism which makes an audible sound when pressed. The click mechanism is actuated when the user presses down against the top portion at this location, to cause tactile feedback, e.g. an audible click. A piece of spring metal can be used for this click portion.

Layer 250 represents the bottom plastic coating. This provides the waterproof seal.

The unit is made of flexible materials including flexible plastic, and flexible metal wires. This allows the keyboard to be rolled or folded for storage and transportation.

Figure 3:
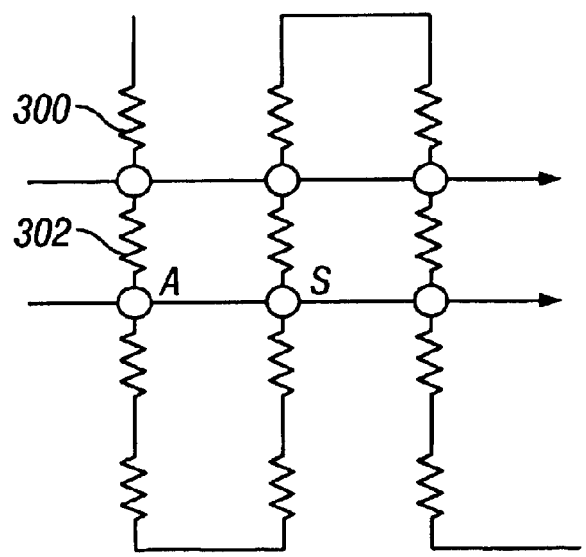
FIG. 3 shows a second embodiment that shows how the key press position can be detected.

FIG. 3 shows an alternative sensing arrangement where a plurality of resistors 300, 302, 304, 306 form a resistive ladder. Each position of pressing is located between two resistive elements. The resistive element causes a unique voltage to be output at that location. The voltage output is converted by the look up table into a desired keyboard entry.

Figure 4A:
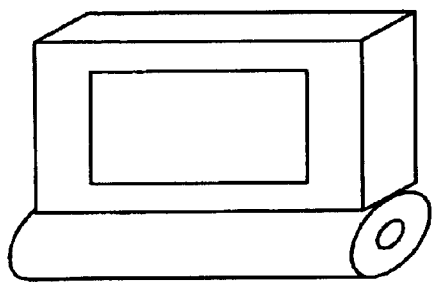
FIGS. 4a and 4b show the device as used with a laptop computer.
Figure 4B:
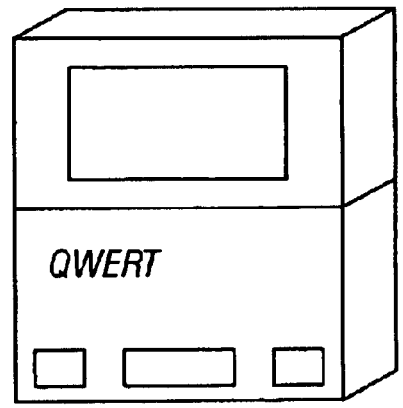

One embodiment is shown in FIGS. 4*a* and 4*b*. FIG. 4*b* shows the keyboard in its unfolded position with the display. FIG. 4*a* shows how the keyboard can be rolled up against the display. Hence, the keyboard portion of a laptop can be significantly reduced in size during storage. In addition, the keyboard can be made to any desired size including a standard size.

Figure 5A:
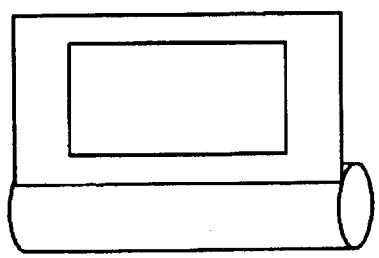
FIGS. 5a and 5b show compacting the keyboard in two axes to allow a full size keyboard to be used with a reduced size display.
Figure 5B:
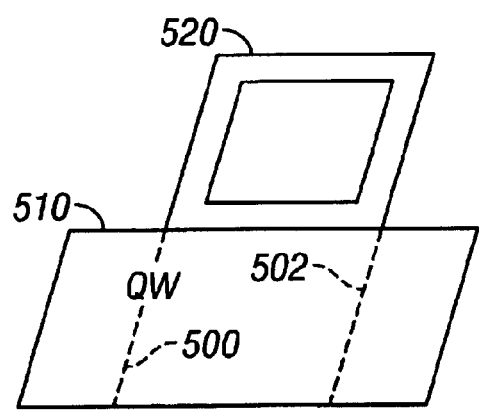

FIGS. 5*a* and 5*b* show how a standard size keyboard can be advantageously used with a much smaller-than-standard-size display.

For example, a folding operation could be used to allow the keyboard to be folded twice and then rolled. The result is shown in FIGS. 5*a* and 5*b*. FIG. 5*b* shows the full size keyboard 510 that is wider than the display. The keyboard can be folded along the fold lines 500, 502 and then rolled into position as shown in FIG. 5*b*.

Although only a few embodiments have been described in detail above, other embodiments are contemplated by the inventor and are intended to be encompassed within the following claims. In addition, other modifications are contemplated and are also intended to be covered.

What is claimed is:

1. A flexible keyboard assembly, comprising:
    a waterproof outer casing including a printing surface that has a plurality of character markings thereon at discrete areas, each said character marking representing an entry which will be represented by pressing on a corresponding area;
    a first plurality of electrically-conducting, flexible elements extending in a first direction;
    a second plurality of electrically-conducting, flexible elements extending in a second direction, different than said first direction and each of said second plurality of elements intersecting each of said first plurality of elements and forming a plurality of intersection points, said plurality of intersection points corresponding to a plurality of said marking locations, said first plurality of elements being spaced from said second plurality of elements, but capable of being pressed into engagement with one another; and
    an encoder, connected to said plurality of elements, and producing an output indicative of a marking at a marking location represented at a pressed intersection; and
    a tactile feedback mechanism which produces an audible sound, actuated based on said pressing; and
    wherein said keyboard assembly has first and second fold locations, enabling said keyboard to be folded twice.

2. An assembly as in claim 1 further comprising a display that is narrower than a width of said keyboard assembly.

3. An assembly as in claim 1 wherein said encoder comprises a device that detects detecting which of the plurality of elements are conducting current.

4. An assembly as in claim 1 wherein said encoder comprises a resistive ladder, each output of which uniquely identifies a position.

5. An assembly as in claim 1, further comprising a look up table that stores a correspondence between said outputs and a character represented thereby, said look up table connected to be addressed by said output.

6. An assembly as in claim 1, wherein said firs and second plurality of elements extend orthogonally o one an another.

7. An assembly as in claim 1, further comprising a tactile feedback part, which produces an audible sound when said first and second plurality of elements are pressed into engagement with each other.

8. An assembly as in claim 1 wherein each of said elements include an insulated portion and a non-insulated portion, wherein adjacent parts of the non-insulated portions on said first plurality of elements are located adjacent to non-insulated portions of said second plurality of elements.

9. An assembly as in claim 8, wherein said elements are substantially cylindrical wires which have an area where insulation is removed, at areas of intersections between said first and second plurality of wires.

10. A flexible keyboard, comprising:
    a grid of orthogonally extending flexible wires which are position-encoded;
    a waterproof cover, including an overlay, including an indication of a plurality of characters, and having a pressing surface allowing pressing against a location at an intersection between two wires of said grid;
    a position detecting circuit, detecting the position of pressing and converting that position of pressing to a character that is represented thereby; and
    a tactile feedback mechanism which produces an audible sound, actuated based on said pressing,
    wherein said keyboard assembly has first and second fold locations, enabling said keyboard to be folded twice.

11. A keyboard as in claim 10, wherein said position detecting circuit is an encoder.

12. A keyboard as in claim 10, wherein said position detecting circuit includes a resistive ladder.

13. A keyboard as in claim 10, wherein said wires have insulated portions and non-insulated portions, and said pressing surfaces are adjacent two non-insulated portions.

* * * * *